United States Patent
Koslawsky et al.

(10) Patent No.: US 6,389,497 B1
(45) Date of Patent: May 14, 2002

(54) DRAM REFRESH MONITORING AND CYCLE ACCURATE DISTRIBUTED BUS ARBITRATION IN A MULTI-PROCESSING ENVIRONMENT

(75) Inventors: Robert Koslawsky, Ramat-Hashron; Zvi Greenfield, Kfar Sava; Alberto E. Sandbank, Zichron-Yaakov, all of (IL)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/235,780

(22) Filed: Jan. 22, 1999

(51) Int. Cl.[7] .......................... G06F 13/14; G06F 12/00
(52) U.S. Cl. ..................... 710/242; 710/5; 711/106
(58) Field of Search ................. 710/240–244, 710/5–7; 711/106

(56) References Cited

U.S. PATENT DOCUMENTS

| | | | |
|---|---|---|---|
| 4,628,482 A | * 12/1986 | Tachiuchi et al. | |
| 4,796,232 A | 1/1989 | House | 365/189 |
| 5,038,276 A | 8/1991 | Bozzetti et al. | |

(List continued on next page.)

FOREIGN PATENT DOCUMENTS

| | | | |
|---|---|---|---|
| EP | 0 737 925 A1 | 10/1996 | G06F/13/368 |
| JP | 60133592 A | * 7/1985 | G11C/11/34 |

OTHER PUBLICATIONS

IBM® Technical Disclosure Bulletin, "Distributed Main Store Bus Arbitration Algorithm and Tie Break Register", vol. 33, No. 4, Sep. 1990, pp. 294–296.

IBM® Technical Disclosure Bulletin, "High–Speed Processor Bus Arbitration", vol. 28, No. 12, May 1986, pp. 5329–5333.

IBM® Technical Disclosure Bulletin, "Method of Providing Local Arbitration Control for Personal Computers", vol. 36. No. 10, Oct. 1993, p. 625.

(List continued on next page.)

*Primary Examiner*—Sumati Lefkowitz
(74) *Attorney, Agent, or Firm*—Wolf, Greenfield & Sacks, P.C.

(57) ABSTRACT

A multiprocessor system includes a distributed bus arbitration system in which bus arbitration takes place simultaneously on each of the multiple processors connected to the bus. Each processor has a local arbitrator of common configuration with the other local arbitrators and a dedicated request line. Each local arbitrator is connected to each dedicated request line to monitor signals on lines indicative of requests for mastership of the bus by the processors. Since each local arbitrator is of common configuration with the other local arbitrators, is operating synchronously with the other arbitrators, and is provided with a similar set of inputs, each arbitrator will arrive at the same conclusion as to which processor is to become bus master. Accordingly, an external bus arbitrator is not required and acknowledge lines are not required to communicate signals indicative of the result of the bus arbitration to the processors. Additionally, the number of priority request lines can be dramatically reduced by requiring a requesting processor to de-assert a bus request upon detecting a priority request by another processor. The multi processor system also includes a distributed DRAM refresh system in which each processor has a local DRAM refresh controller of common configuration with the other DRAM refresh controllers. Signals on a refresh line are monitored by each of the local DRAM refresh controllers to enable synchronous updating of local DRAM refresh counters and resets of the local DRAM refresh counters. Thus, as mastership of the bus passes from one processor to the other, the new bus master's local DRAM refresh controller can continue the DRAM refresh process without requiring information to be transferred from the old bus master to the new bus master, and without duplicating DRAM refresh operations.

5 Claims, 7 Drawing Sheets

U.S. PATENT DOCUMENTS

| | | | |
|---|---|---|---|
| 5,261,109 A | | 11/1993 | Cadambi et al. ............ 395/725 |
| 5,265,212 A | | 11/1993 | Bruce, II |
| 5,265,223 A | | 11/1993 | Brockmann et al. ........ 395/325 |
| 5,265,231 A | * | 11/1993 | Nuwayser ................... 711/106 |
| 5,301,283 A | | 4/1994 | Thacker et al. |
| 5,313,591 A | | 5/1994 | Averill |
| 5,438,666 A | | 8/1995 | Craft et al. |
| 5,446,696 A | | 8/1995 | Ware et al. |
| 5,487,157 A | | 1/1996 | Mizugaki |
| 5,638,529 A | | 6/1997 | Yee et al. ................... 395/433 |
| 5,740,174 A | | 4/1998 | Somer |
| 5,926,429 A | * | 7/1999 | Saitoh et al. ................ 365/222 |
| 5,959,923 A | * | 9/1999 | Matteson et al. ........... 365/222 |

OTHER PUBLICATIONS

IBM® Technical Disclosure Bulletin, "Transparent Fairness for Devices On the SCSI Bus", vol. 32, No. 11, Apr. 1990, pp. 439–441.

IBM® Technical Disclosure Bulletin, "Enhanced Arbitration Method For Personal Computers", vol. 36. No. 1, Jan. 1993, pp. 384–387.

* cited by examiner

DRAM REFRESH MONITORING AND CYCLE ACCURATE DISTRIBUTED BUS ARBITRATION IN A MULTI-PROCESSING ENVIRONMENT

GOVERNMENT LICENSE RIGHTS

The U.S. Government may have a license in this invention and the right under limited circumstances to require the patent owner to license others on reasonable terms as provided for by the terms of contract no. N6601-96-C-8610 awarded by the Defense Logistics Agency to Analog Devices, Inc.

BACKGROUND OF THE INVENTION

1. Field of the Invention

The present invention relates generally to a multi-processor computer system and, more particularly, to a method and apparatus for distributing housekeeping functions between multiple processors in a multi-processor computer system.

2. Related Art

A computer typically has one or more central processing units ("processors") in addition to dedicated functional units, such as a memory, a bus arbitration unit, a memory refresh controller, and one or more data and instruction caches, all of which will be referred to herein as "components." A computer system having more than one processor will be called a multi-processor system.

Communication between the processors and components takes place over a system bus that interconnects the components and processors. Communication over the bus takes place in a "transaction." As is well known, instances may arise in which more than one processor is trying to issue a transaction on the bus at the same time. The process of determining which of the processors will control the bus and hence be allowed to issue a transaction on the bus in this situation is referred to as arbitration. The processor that wins the arbitration is referred to herein as the "bus master."

Arbitration takes place in the bus arbitration unit. In a single processor system, the bus arbitration unit may be external to the processor or may be internal to the processor. A functional unit such as a bus arbitration unit will be referred to as "internal" when the functions performed by the functional unit are at least partially performed by the processor. Conversely, a functional unit will be referred to as "external" when the functions performed by the functional unit are not performed by the processor. As is well known in the art, an external functional unit typically includes dedicated circuitry configured to perform a specific set of functions.

FIG. 1 illustrates an exemplary multi-processor computer system using an external bus arbitrator to perform bus arbitration. As shown in FIG. 1, the multi processor system has a host 10 and a plurality of processors 12a, 12b ... 12n all connected to a system bus 14. An external arbitration unit 13 receives signals on bus request lines (R) and determines which of the requesting processors should be granted bus mastership according to any known protocol. The processor (or host) that wins the arbitration is notified via a signal on an acknowledge line (A) connecting the arbitrator 13 and the processor or host. To become bus master, a processor asserts a signal on its bus request line (R) and waits for the external bus arbitration unit 13 to grant it mastership of the bus via a signal on its associated acknowledge line (A). Arbitration using an external bus arbitrator thus requires both a request and an acknowledge line for each processor.

In many computer systems, including the system illustrated in FIG. 1, different types of transactions are deemed to be more important than other types of transactions. For example, a computer system may give transactions involving direct memory access (DMA) priority over other types of transactions. To accommodate requests of varying priority, it is common in such systems to interconnect the processors 12a–12n the and bus arbitration unit 13 with one or more priority request lines (P). When a processor desires to issue a priority transaction on the bus, the processor asserts a signal over its priority request line. The external arbitration unit 13 processes the request and assigns the bus preferentially to the processor asserting the signal over the priority request line.

Arbitration using an external bus arbitration unit 13 may become space intensive since multiple dedicated lines must be provided to interconnect each processor 12a–12n and host 10 with the external arbitration unit 13. In the illustrated example, one request line, one acknowledge line, and at least one priority request line are necessary to perform bus arbitration for each processor. When the number of processors connected to the bus is large, a significant amount of space is required to be used for arbitration.

In addition to multiple processors, computers typically employ solid-state memory components such as dynamic random access memory (DRAM) components. The term DRAM will be used herein to refer to any type of dynamic random access memory, including DRAM (dynamic RAM), SDRAM (synchronous DRAM), DRDRAM (direct rambus DRAM), and other types of memory.

Digital information held in DRAM is generally in the form of charge stored on a two dimensional array of capacitors. The charge stored on each capacitor may be sensed during a read operation or changed during a write operation. Additionally, charge is steadily lost over time due to leakage. The amount of leakage depends upon processing and operating conditions, as well as on environmental factors such as temperature and supply voltage. Because of this leakage, the charge on individual capacitors in the capacitor array of the DRAM must be refreshed periodically.

To perform a refresh operation, digital information is conventionally read from the DRAM and immediately re-written into the DRAM. In this way, the charge on the individual capacitors may be enhanced without changing the content of the memory array. To ensure the integrity of the content of the memory array, the DRAM must be refreshed before the leakage causes the charge stored in the capacitors to drop below a predetermined level. Since DRAM is typically organized in rows and columns, refresh of the DRAM is performed typically row-by-row, although other refresh schemes are also possible.

Control of the DRAM refresh procedure in a multiple processor environment is typically handled by an external DRAM refresh controller. The external DRAM refresh controller has a refresh counter indicating the row to be refreshed and a reset enabling the refresh counter to be reset, for example, to the first row. Although the functions performed by the DRAM refresh controller are important to operation of the computer, the DRAM refresh controller consumes valuable space that otherwise could be used for other components. Additionally, the DRAM refresh controller must be connected to the DRAM either through one or more dedicated lines or over the system bus. When the DRAM refresh controller uses the system bus to control DRAM refresh operations, system performance as a whole is degraded by reducing the amount of data that otherwise could be transferred. When the DRAM refresh controller is connected to the DRAM through one or more dedicated lines, valuable space is consumed that could otherwise be used for other purposes.

Accordingly, what is needed is a method and apparatus that will facilitate performance of maintenance functions, such as bus arbitration and DRAM refresh operations, in a multi-processor environment while minimizing the amount of space and other system resources required to perform these functions.

SUMMARY OF THE INVENTION

The present invention is a method and apparatus that will facilitate performance of maintenance functions, such as bus arbitration and DRAM refresh operations, while minimizing the amount of space required to perform these functions in a multi-processor environment.

In one embodiment of this invention, each processor is provided with a local arbitration unit of common configuration with the other local arbitration units to perform bus arbitration simultaneously. Each local arbitration unit monitors requests to become bus master by itself and other processors, is synchronized with the other arbitrators, and is provided with similar logic. Accordingly, each local arbitration unit independently determines the identity of the subsequent bus master. By providing local arbitrators that each independently determine allocation of bus mastership, the multi-processor system is able to eliminate the need for acknowledge lines associated with arbitration. This greatly reduces the amount of area required for arbitration.

Similarly, to perform DRAM refresh operations, each processor is provided with a local DRAM refresh controller having at least one pin connected to one or more dedicated DRAM refresh lines. In a preferred embodiment, each processor has one pin connected to a single DRAM refresh line. Each local DRAM refresh controller, when responsible for performing DRAM refresh operations, issues DRAM refresh signals to the DRAM over the DRAM refresh line. When not responsible for performing DRAM refresh operations, each local DRAM refresh controller monitors the DRAM refresh line, senses DRAM refresh signals issued by other DRAM refresh controllers, and uses the sensed signals to update its DRAM refresh row counter. A reset line may also be provided to reset the counter. Alternatively, reset of the controller may be performed via the single DRAM refresh line. Providing each processor with a local DRAM refresh controller eliminates the need for an external DRAM refresh controller thus saving space and removing the DRAM refresh controller as a contending component for mastership of the bus. Also, by ensuring that each DRAM refresh controller has current information relating to DRAM refresh operations, duplication of refresh operations is minimized during hand-offs between processors. Thus, the newly responsible DRAM refresh controller is able to continue the DRAM refresh operation where the last processor's DRAM refresh controller stopped.

BRIEF DESCRIPTION OF THE DRAWINGS

This invention is pointed out with particularity in the appended claims. The above and further advantages of this invention may be better understood by referring to the following description when taken in conjunction with the accompanying drawings, in which:

DETAILED DESCRIPTION

In one embodiment, the multi processor system of this invention includes a distributed bus arbitration system in which bus arbitration takes place simultaneously on each of the multiple processors connected to the bus. Each processor has a local arbitrator of common configuration with the other local arbitrators and a dedicated request line. Each local arbitrator is connected to each dedicated request line to monitor signals on lines indicative of requests for mastership of the bus by the processors. Since each local arbitrator is of common configuration with the other local arbitrators, is operating synchronously with the other arbitrators, and is provided with a similar set of inputs, each arbitrator will arrive at the same conclusion as to which processor is to become bus master. Accordingly, an external bus arbitrator is not required and acknowledge lines are not required to communicate signals indicative of the result of the bus arbitration to the processors. Additionally, the number of priority request lines can be dramatically reduced by requiring a requesting processor to de-assert a bus request upon detecting a priority request by another processor.

In another embodiment, the multi processor system includes a distributed DRAM refresh system in which each processor has a functionally equivalent local DRAM refresh controller. Signals on a refresh line are monitored by each of the local DRAM refresh controllers to enable synchronous updating of local DRAM refresh counters and resets of the local DRAM refresh counters. Thus, as mastership of the bus passes from one processor to the other, the new bus master's local DRAM refresh controller can continue the DRAM refresh process without requiring information to be transferred from the old bus master to the new bus master, and without duplicating DRAM refresh operations.

Figure 1:
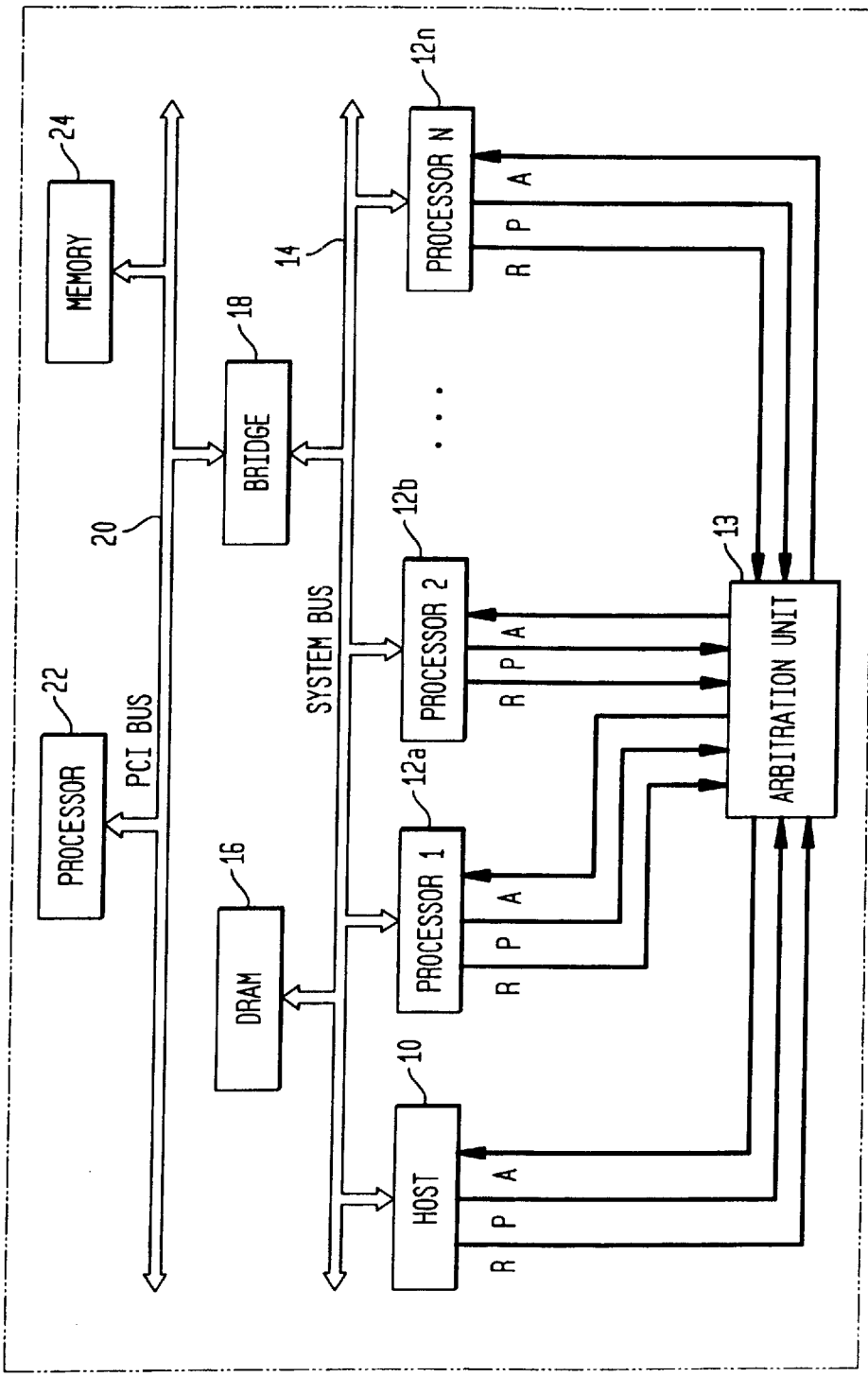
FIG. 1 is a functional block diagram of a conventional multi processor system.
Figure 2:
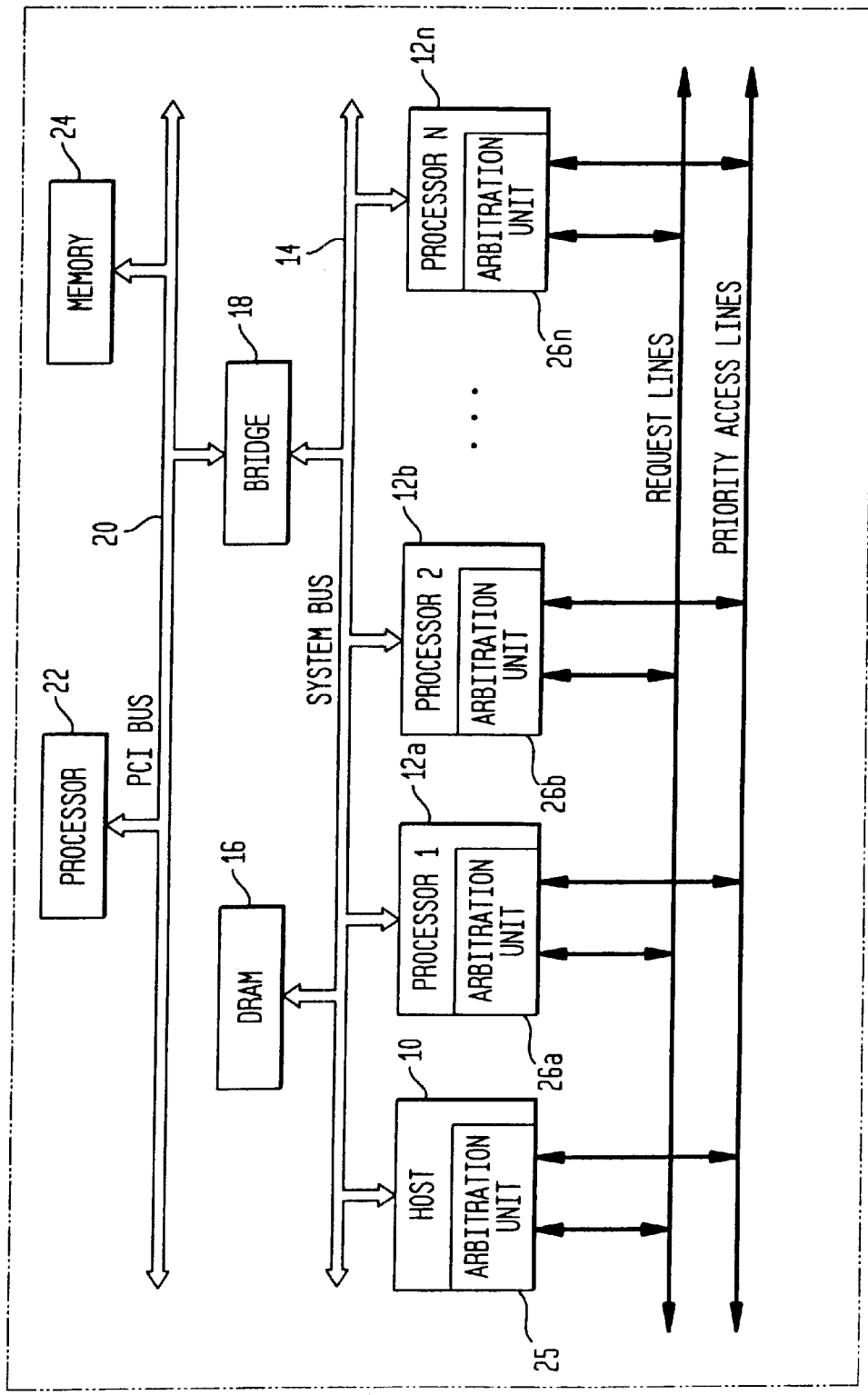
FIG. 2 is a functional block diagram of a multi processor system according to one embodiment of this invention.

In the multi processing system of FIG. 2, a host 10 and a plurality of processors 12a–12n are connected by a system bus 14. A DRAM 16 is connected to the system bus 14 and a bridge 18 connects the system bus to an external bus 20, such as a peripheral component interconnect (PCI) bus. Components such as a processor 22 and a memory 24 may be connected to the PCI bus 20, as may numerous other components. Each processor 12a–12n includes a local arbitration unit 26, 26a–26n interconnected by request lines and priority access lines. The host 10 is provided with a host arbitration unit that may be of common configuration with the local arbitration units 26a–26n or may be differently configured, as described in more detail below. The interconnection between the system bus 14, host 10 and processors 12, as well as the arbitration lines are illustrated in more detail in FIG. 3.

Figure 3:
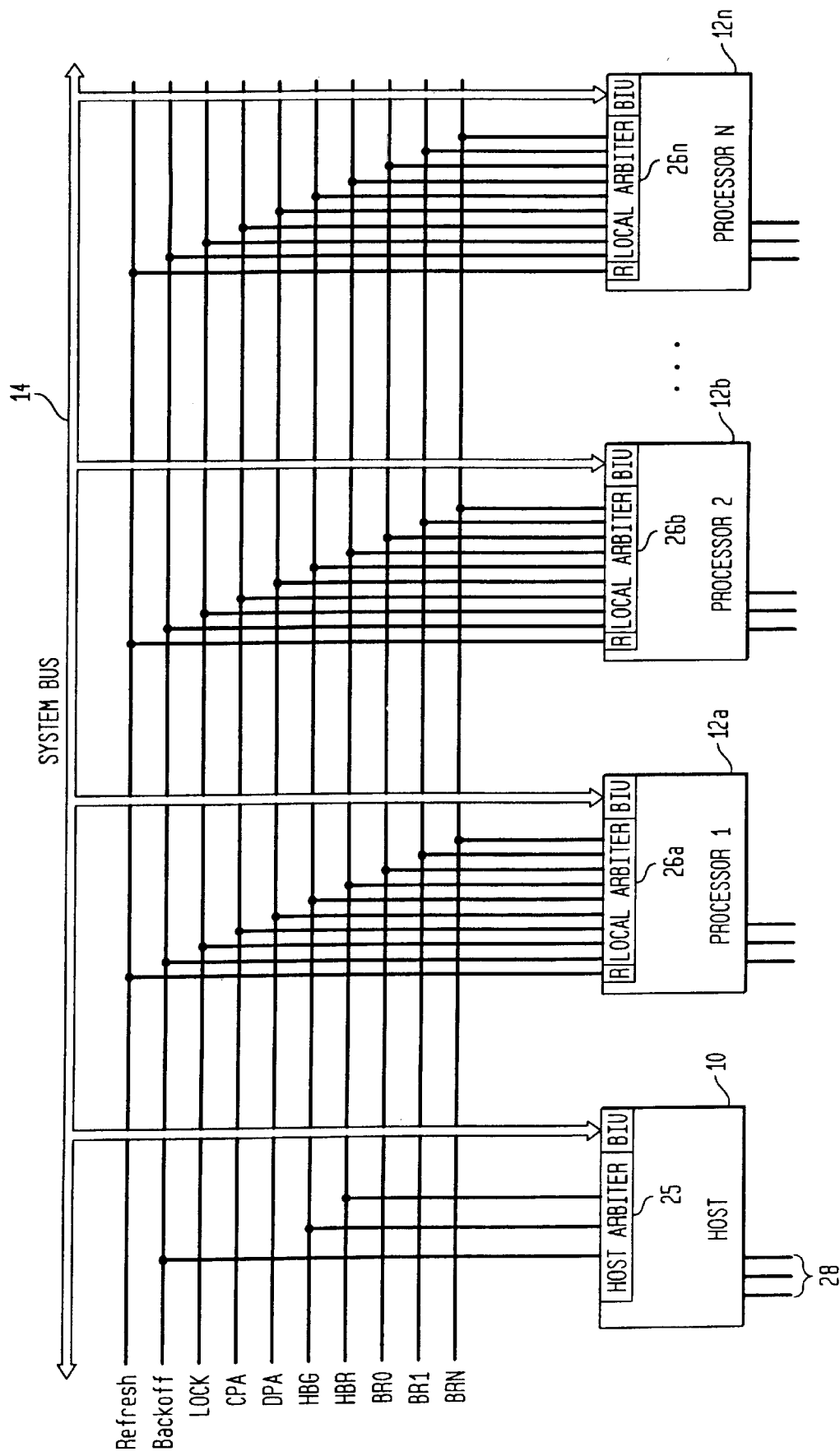
FIG. 3 is a functional block diagram of a bus arbitration system for use in the multi-processor system of FIG. 2.

As shown in FIG. 3, a distributed arbitration system includes a host 10 and processors 12a–12n connected to the system bus 14. The system bus 14 may be any known bus over which transactions may take place. Local arbitrators 26a–26n are contained in each processor 12a–12n. A host arbitrator 25 is similarly contained in the host 10. Although arbitrators 25, 26a–26n may be external to the host 10 and processors 12a–12n, it is currently envisioned that the arbitrators 25, 26a–26n will be internal to the host 10 and processors 12a–12n respectively. The local arbitrators 25, 26a–26n may be formed of common configuration. Alternatively, the host arbitrator 25 may be configured differently than the local arbitrator 26a–26n. Forming the local arbitrators 26a–26n and optionally the host arbitrator 25 of common configuration enables the arbitrators to each arrive at the same result given a particular set of inputs.

Figure 9:
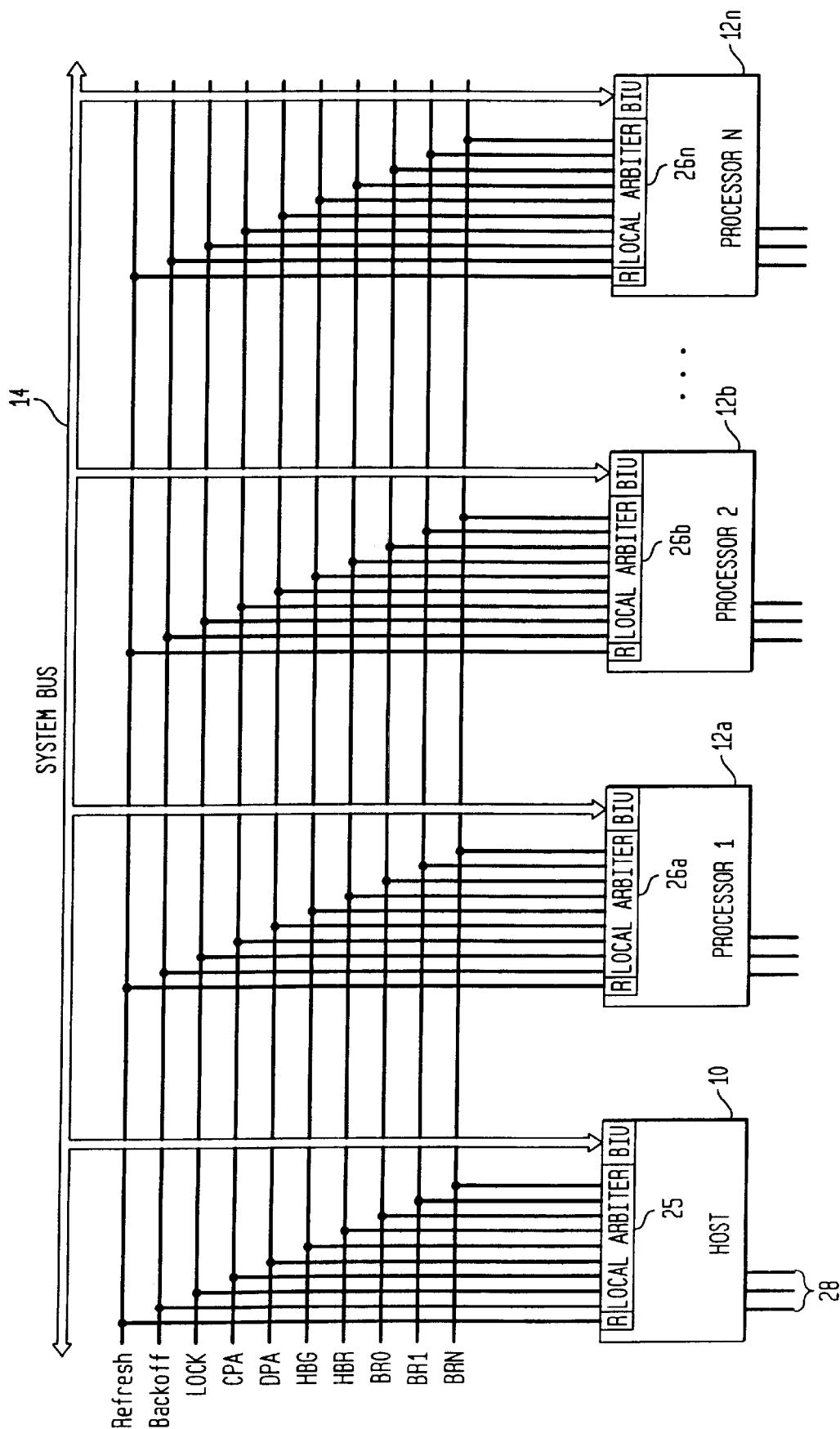
FIG. 9 is a functional block diagram of a bus arbitration system for use in the multi-processor system of FIG. 2 in the case that the host is provided with a memory refresh controller of common configuration with the other memory refresh controllers contained in the processors.

In the following discussion, it is assumed that the host 10 has a host arbitration unit 25 that is not of common configuration with the local arbitration units 26a–26n. If, however, it was desired to do so, the host 10 could be provided with a commonly configured local arbitration unit In this situation, arbitration with the host 10 could take place in a manner similar to the remaining processors. FIG. 9 illustrates this alternative embodiment. When one of the processors needs to issue a transaction on the system bus 14, the processor will assert a signal to become bus master on its associated bus request line. Since every local arbitrator 26a–26n is connected to the processor's bus request line, every local arbitrator 26a–26n will receive the signal on processor's bus request line and use that input in any upcoming arbitration. Since all local arbitrators 26a–26n in a cluster of processors 12a–12n operate synchronously (in lock-step on a cycle by cycle basis), every processor 12a–12n keeps track and follows the arbitration sequence of the system bus 14. If, therefore, the result of a subsequent arbitration is that the requesting processor is to become bus master, mastership will be granted to the requesting processor without requiring the arbitration result to be communicated to the requesting processor. In this instance, all other processors will recognize the requesting processor's right to master the system bus 14 and refrain from issuing transactions on the system bus 14. Likewise, if the result of the arbitration is that the requesting processor is not to become bus master, its associated local arbitrator will prevent the requesting processor from attempting to issue a transaction on the system bus 14.

One unique aspect of using local arbitrators 26a–26n instead of a remote arbitrator 13 is that there is no need to communicate the result of the arbitration to the processors 12a–12n. Instead, each processor 12a–12n is provided with the arbitration result directly from its local arbitrator 26a–26n. Accordingly, acknowledge lines are not required. This substantially reduces the amount of space required to perform arbitration.

Figure 4:
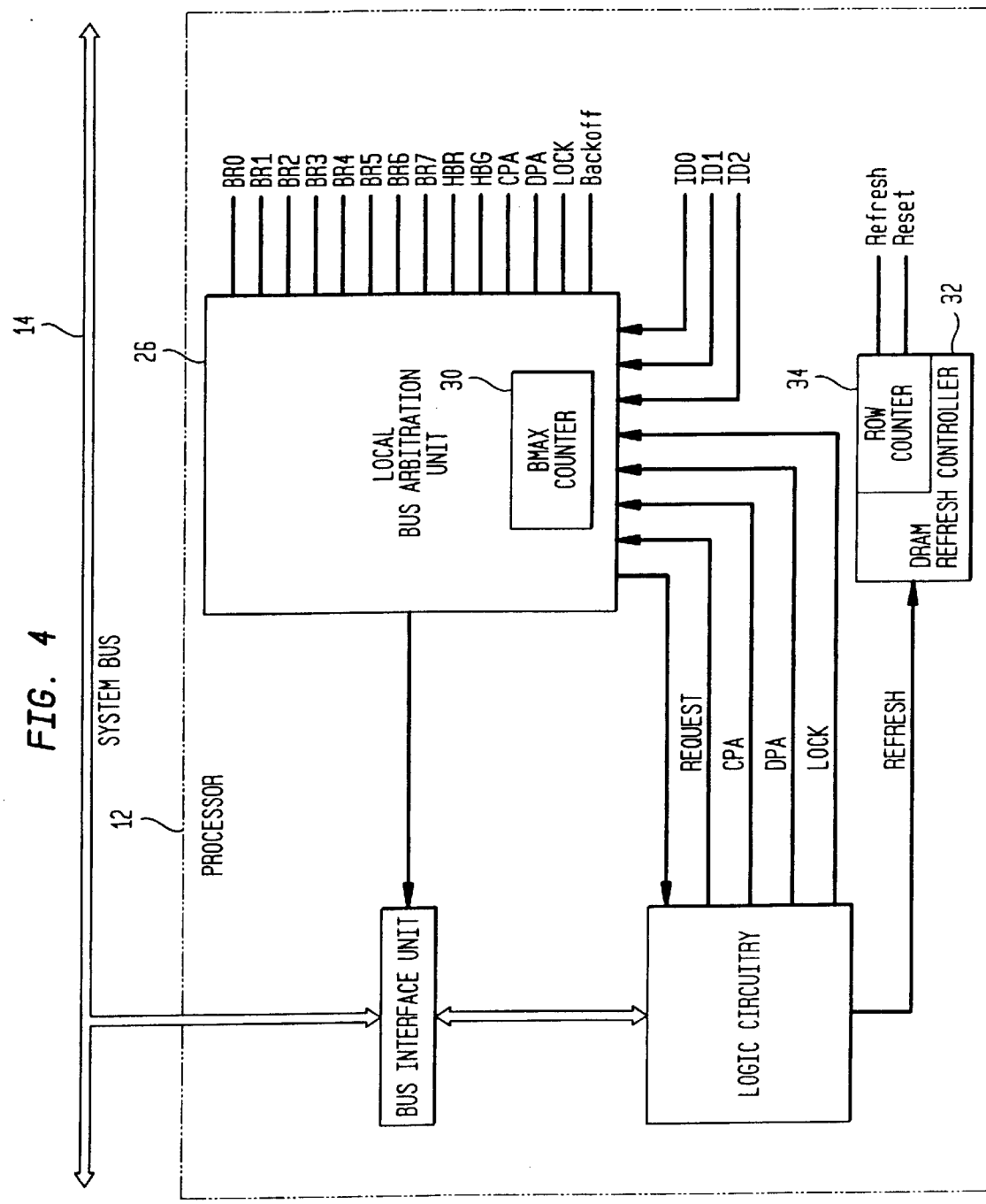
FIG. 4 is a functional block diagram of a processor for use in the bus arbitration system of FIG. 3.

As shown in FIGS. 3 and 4, bus arbitration is accomplished using signals on lines BR0–BR7, HBR and HBG. The signals may be digital, analog, optical or any other type of signal useable to communicate information between host 10 and processors 12a–12n. Signals on lines BR0–BR7 are used to arbitrate between processors 12a–12n, and signals on lines HBR and HBG are used to pass control of the system bus 14 to and from the host 10. In this context, a signal on line BR0 is used by processor 0 to request mastership of the bus 14, a signal on BR1 is used by processor 1 to request mastership of the bus 14, etc. A signal on line HBR is used by the host 10 to request mastership of the bus 14 and a signal on line HBG is used to pass mastership of the bus 14 to the host 10. Dedicated pins on the host 10 and processors 12a–12n enable continuous access to and monitoring of signals on the lines used for arbitration.

Since the local arbitrators 26a–26n must have a dedicated input pin to monitor signals on the request line of the host 10 and each processor 12a–12n taking place in the arbitration, the number of processors 12a–12n that may arbitrate for mastership of the system bus 14 is limited by the hardware used to implement the local arbitrators 26, 26a–26n. Accordingly, for example in the illustrated embodiment, each arbitrator 26, 26a–26n has 10 input pins connected to lines HBR, HBG and BR0–BR7. Thus, in this embodiment, up to 8 processors 12a–12n can arbitrate for mastership of the system bus 14 simultaneously. If fewer than the maximum number of processors are connected to the system bus 14, the unused pins are de-asserted to prevent the local arbitrators from attempting to grant bus mastership to a non-participating processor. Although the illustrated embodiment shows eight processors connected to the system bus 14, this number may be varied by altering the number of bus request lines and pins or by de-asserting several of the bus request lines. Accordingly, the concepts disclosed herein are not limited to a system using eight processors, and apply equally to a system using at least two processors.

Each processor 12a–12n is provided with an identification number. In an exemplary embodiment, the identification number is assigned to the processor 12a–12n using one or more identification pins 28a–28n. Any other method of identifying the processors may be used as well.

When one of the processors 12x desires to become master of the bus, it asserts signal on its own bus request line, monitoring at the same time the other bus request lines for signals. If no signal from a processor with a higher priority is asserted on another bus request line, mastership of the bus is passed to the new requester after the current bus master completes its transactions. The new bus master retains bus mastership by asserting the signal on its bus request line continuously as long as it is the master. The processor that is bus master retains mastership of the bus until (1) it has no more pending transactions; (2) a counter 30 expires and mastership is passed to another requesting processor to prevent starvation of the bus; or (3) its mastership is interrupted to enable higher priority transactions to take place. Transfer of mastership occurs by the current bus master de-asserting its bus request line.

When the current master relinquishes the system bus 14, it de-asserts the signal on its associated bus request line, and is assigned the lowest priority. In the present embodiment an idle cycle is inserted when mastership is passed from the current master to the new master. Pipelining mastership of the bus may be possible using known techniques to eliminate this idle cycle, although in the presently preferred exemplary embodiment there is no pipeline between masters.

A rotating bus priority scheme is implemented to ensure bus fairness between processors 12a–12n. If two or more processors simultaneously assert bus request signals on their associated bus request lines the processor with the highest priority is granted mastership of the bus. Priority between processors may be determined in any other known manner.

When a requesting processor is not granted mastership of the bus, the requesting processor continuously asserts its bus request signal on its associated bus request line until it is granted mastership of the bus, it is required to de-assert the signal to accommodate a higher priority request or it no longer requires mastership of the system bus 14.

It may be desirable to limit the time that a single processor retains mastership of the bus to prevent bus starvation of other processors in the system. To provide this limit, the counter 30 (see FIG. 4) is provided in each local arbitrator 26a–26n. The counter 30 defines the maximum amount of time that the processor may master the bus 14 when other processors are also requesting mastership of the bus. The counter 30 is initiated to a predefined value when the processor attains mastership of the system bus 14 and starts counting up or down. Counting is paused if mastership of the bus is temporarily transferred to the host or another processor with a higher priority transaction. If the counter 30 reaches a second predefined value, and another processor is requesting mastership of the bus 14, the processor completes its transaction and relinquishes mastership of the system bus 14 for at least one cycle. If no other request for mastership of the system bus 14 has been asserted when the counter 30 reaches the second predefined value, the counter 30 is reset and starts to count up or down once again while the processor 12 continues to retain mastership of the bus. In one preferred embodiment, one of the first and second predefined values is zero, thus resulting in a system with only a single predefined value.

As alluded to above, several types of transactions are deemed to be more important than other types of transactions. To accommodate these transactions, a processor or the host 10 with a priority transaction can temporarily interrupt the current bus master and obtain temporary mastership of the system bus 14. In the illustrated embodiment, a processor with core priority access (CPA) transaction or a DMA priority access (DPA) transaction is allowed to interrupt the current bus master and obtain temporary mastership of the bus. To facilitate these higher priority transactions, a CPA line and a DPA line are provided over which processors 12a–12n may assert priority request signals to obtain mastership of the bus. Likewise, the host 10 can obtain temporary mastership of the bus by asserting a signal on a host bus request line HBR. Use of the CPA, DPA and HBR lines is discussed in greater detail below.

A processor 12x will assert a signal on the CPA priority request line when it has a core transaction that needs to accesses external memory. This allows a processor to interrupt background transfers of a DMA channel belonging to the bus master and gain control of the system bus 14. The current bus master in this situation terminates its transaction and passes mastership of the bus to the requesting processor by de-asserting the signal on its associated bus request line. When a signal is asserted on the CPA priority request line, only processors with core transactions can request the bus 14. The other requesting processors de-assert their bus request lines when they sense that a signal on the CPA priority request line has been asserted. When more than one processor requests the system bus 14 by asserting a signal on its bus request line along with a signal on the CPA priority request line, the processor with the highest priority gains bus mastership. Allocation of bus mastership between processors of equal priority is discussed above, and may be implemented using any known protocol.

Requiring those processors not asserting a signal on the CPA priority request line to de-assert signals on their respective bus request lines enables priority requests to be processed simultaneously by the local arbitrators 26a–26n using a single line. Specifically, since the protocol requires all processors not asserting a signal on the CPA priority request line to de-assert signals indicative of requests for mastership of the bus once a signal on the CPA priority request line is sensed, any bus request line that is asserted when a signal on the CPA priority request line is asserted necessarily must have a high priority transaction. Accordingly, arbitration between multiple processors with simultaneous priority transactions can take place using only a single priority line. An example may be illustrative of this process.

With reference to FIG. 3, suppose that the following signals were asserted simultaneously:
Processor 1—BR1, CPA
Processor 2—BR2, CPA
Processor 3—BR3
Processor 4—BR4.

Upon determination by processors 3 and 4 that a signal on the CPA priority request line had been asserted, processors 3 and 4 de-assert signals on their bus request lines BR3 and BR4 respectively. At this point in time, only signals on the bus request lines associated with processor 1 and 2, (BR1, BR2) and a signal on the CPA priority request line are asserted. Accordingly, the arbitrators 26a–26n realize that two processors have simultaneously asserted signals on the CPA priority request line, and thus that two high priority requests have been made. Accordingly, the arbitrators 26a–26n can allocate priority of bus mastership between processors 1 and 2 according to an ordinary priority scheme. In this manner, interpreting combinations of asserted lines enables priority access to the system bus 14 to be handled using a single priority request line without requiring a dedicated priority request line for each processor 12.

Multiple levels of priority can be implemented in a similar fashion using additional priority access lines. For example, in the embodiment illustrated in FIG. 3, a second level of priority is provided using a DPA priority request line. A signal on the DPA priority request line is asserted by a processor when the processor needs to perform a high priority DMA transaction involving external memory. Since these transactions are deemed to be of lower priority than CPA transactions, a processor 12a–12n will only assert a signal on the DPA priority request line when a signal on the CPA priority request line is not asserted. Assertion of a signal on the DPA priority request line allows a high priority DMA channel belonging to a slave processor 12 to interrupt background transfers of a regular priority DMA channel belonging to a master processor and gain temporary mastership of the bus 14.

When a signal on the DPA priority request line is asserted, the current master terminates its transaction and passes bus mastership to the requesting processor by de-asserting the signal on its bus request line. Likewise, any other requesting processors that do not have a transaction for which assertion of a signal on the DPA priority request line or CPA priority request line would be appropriate, de-assert signals on their bus request lines when they sense that a signal on the DPA priority request line is asserted. Stated differently, when a signal on the DPA priority request line is asserted, only processors 12a–12n with core transactions or transactions involving high priority DMA transfers can request the bus. When more than one processor requests the system bus 14 by asserting a signal on its respective bus request line along with a signal on the DPA priority request line, the processor with the highest priority gains bus mastership. By requiring processors 12a–12n to de-assert signals on their respective bus request lines when a signal on the DPA priority request line is asserted (and they are not asserting a signal on the DPA priority request line) a single line may be used to provide DMA priority access to all processors 12a–12n. Using a combination of signals on the bus request lines and priority request lines enables the bus arbitration units to accommodate multiple priority levels using a minimum number of lines.

In this arbitration process, requesting processors asserting a signal on the CPA priority request line have higher priority over requesting processors asserting signals on the DPA priority request line. Thus, requesting processors asserting a signal on the DPA priority request line will de-assert signals on their respective bus request lines (and the DPA priority request line) upon sensing that a signal on the CPA priority request line has been asserted by another processor.

Other priority schemes may be used as well, involving more or fewer priority request lines. For example, three, four or more priority request lines could be used to provide for three, four or more levels of priority. Also, simultaneous assertion of signals on two or more priority request lines (such as simultaneous assertion of signals on the CPA priority request line and DPA priority request line) by the same processor may be used to provide additional levels of priority. Accordingly, combinations of request signals and priority signals enable multiple levels of priority to be accommodated using a minimum number of priority request lines.

The host 10 can be the bus master. When the host 10 would like to become bus master, it causes its host arbitration unit 25 to assert a signal on a host bus request line (HBR). The current bus master, upon determining that a signal has been asserted on line HBR, completes its current transaction and relinquishes the system bus 14 by asserting a signal on a host bus grant line (HBG). The host 10, maintains the signal on line HBR asserted as long as it requires the bus. The master which last relinquished the system bus 14 maintains a signal on its respective bus request line asserted so that when the host 10 de-asserts the signal on line HBR, it retains mastership of the bus.

Occasionally, the bus master may engage in transactions that cannot safely be interrupted. Accordingly, it may become important for the bus master to lock the system bus 14 to prevent mastership of the bus from being temporarily reassigned. Accordingly, the arbitration system provides the ability for a processor 12 to lock the bus. Specifically, to lock the bus, the bus master asserts and maintains a signal on its bus request line, obtains mastership of the bus, and then asserts a signal on a line dedicated to locking the bus, referred to herein as the lock line. When a signal on the lock line is asserted, assertion of a signal on the CPA or DPA priority request lines or the host bus request lines will not affect mastership of the bus. Similarly, expiration of the counter 30 will not cause mastership of the system bus 14 to be relinquished. The only situation where mastership of the system bus 14 is affected after the system bus 14 has been locked is when a signals on both the host bus request line and the backoff line are asserted simultaneously. After the bus master has completed its transaction requiring the system bus 14 to be locked, the signal on the lock line is de-asserted and ordinary arbitration resumes.

Each processor is also provided with a back-off pin connected to a line used to back the current processor off the bus, referred to herein as the backoff line. Unless a signal on the lock line has been asserted, the processor that is the current bus master will immediately cede mastership of the bus 14 upon assertion of a signal on the backoff line. This process is described below.

Referring now to FIG. 2, a situation may occur where a local processor would like to issue a transaction to read from the memory attached to the PCI bus 20. The local processor will arbitrate for and obtain mastership of the system bus 14 and issue the transaction to the PCI bus 20 over the bridge 18. At the same time, however, the processor 22 on the PCI bus 20 may be attempting to read from a memory connected to the system bus 14 or from the local processor's memory. In this situation, both the local processor and the external processor 22 connected to the PCI bus 20 are attempting to gain access to the system bus 14 simultaneously. Also, since the local and external processors are not associated with each other, there is no arbitration protocol that will determine mastership between the local processor and the external processor 22. This situation is known as deadlock.

To resolve deadlock, each processor is provided with a backoff pin connected to the backoff line. The bridge 18, sensing that deadlock has occurred, will assert a signal on the backoff line. Assertion of a signal on the backoff line terminates mastership of the system bus 14 to all processors 12 and the host 10 pending completion of the transaction by the remote processor 22. Upon completion of the transaction by the remote processor 22, the bridge 18 will de-assert the signal on the backoff line, and the local processor 12 that originally had mastership of the system bus 14 will be allowed to complete its transaction. In this case, the local processor with mastership of the system bus 14 would be allowed once again to attempt to access the memory connected to the PCI bus 20.

One embodiment of an arbitration protocol will now be described in more detail with reference to the signal diagrams illustrated in FIGS. 5–8. Any arbitration protocol capable of allocating mastership of the system bus 14 between the host 10 and processors 12*a*–12*n* could be used instead of or in addition to the illustrated protocol. The exemplary protocol illustrates one way of passing mastership of the bus between the multiple processors and host equitably, while enabling higher priority tasks to be granted preferential access to the bus. In the described protocol, mastership of the bus is granted to a requesting device in the following order of priority:

(1) Host 10 (a signal on HBR asserted)
(2) Processor 12 (a signal on BR along with a signal on CPA asserted)
(3) Processor 12 (a signal on BR along with a signal on DPA asserted)
(4) Processor 12 (a signal on BR asserted).

Even if the processor has mastership of the bus, however, there are several instances where the processor will be required to yield mastership temporarily to another requesting processor or host 10. These conditions include:

(1) A signal on the backoff line is asserted and signals on the host bus grant and lock lines are not asserted (external processor obtains temporary mastership of bus 14).
(2) The current master does not request the system bus 14 and another processor or the host 10 asserts its bus request line or host bus request line (new processor or host 10 obtains mastership of bus 14).
(3) The current master requests the system bus 14 by asserting a signal on its bus request line and optionally a signal on the DPA priority request line but not the CPA priority request line, and another processor asserts a signal on its bus request line and the CPA priority request line (new processor becomes temporary bus master).
(4) The current master requests the system bus 14 by asserting a signal on its bus request line but not on the CPA or DPA priority request lines, and another processor asserts a signal on its bus request line and the DPA priority request line (new processor becomes temporary bus master).
(5) The current master request the system bus 14 by asserting a signal on its bus request line and optionally a signal on the CPA or DPA priority request line, and the host 10 asserts a signal on the host bus request line host 10 becomes temporary bus master upon completion of the current transaction and assertion of a signal on the host bus grant line by the current master).

(6) The current master request the system bus 14 by asserting a signal on its bus request line and optionally a signal on the CPA or DPA priority request line, but the value of the counter 30 expires and another processor asserts a signal on its bus request line (new processor becomes bus master).

Signal diagrams of signals on arbitration lines are illustrated in FIGS. 5–8. In these figures, arbitration takes place as discussed above in multiple commonly configured local arbitration units 26a–26n simultaneously. All arbitration units are operating synchronously. A clock signal, MCLK, is provided to time operations of the arbitration units and the system bus. To facilitate understanding of the arbitration process, only signals on bus request lines associated with three processors (BR0, BR1 and BR2) are illustrated. In the signal diagrams of FIGS. 5–8, a signal is asserted when the signal is low. The converse convention could be adapted as well.

Figure 5:
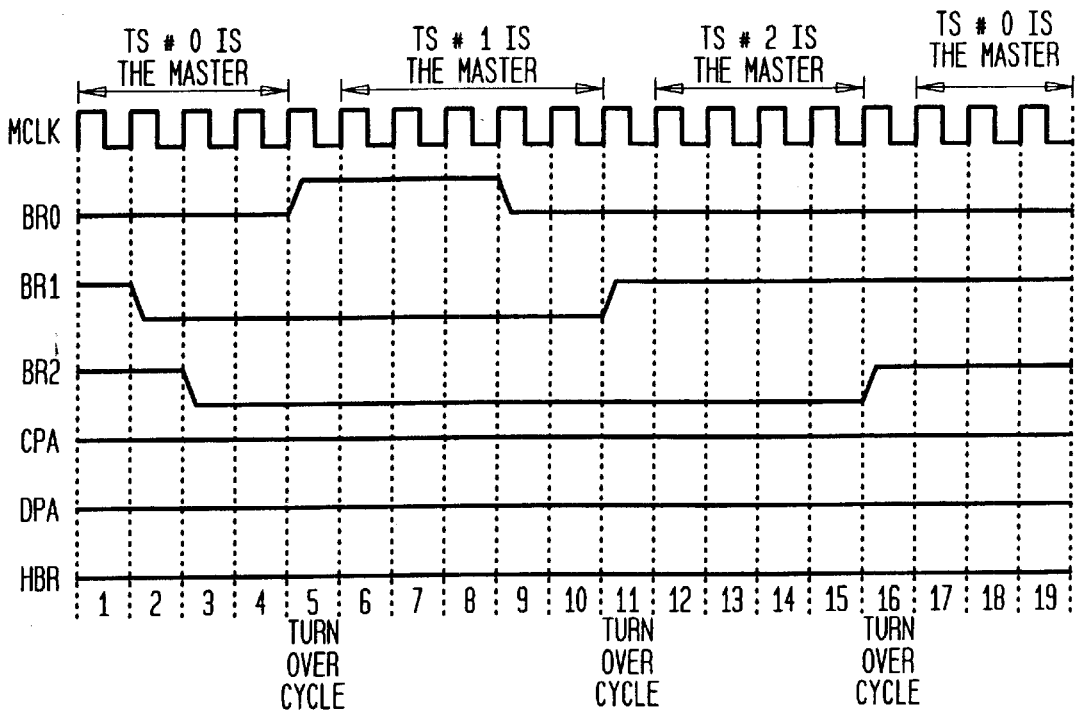
FIGS. 5–8 are timing diagrams illustrating aspects of the bus arbitration protocol according to one embodiment of this invention.

FIG. 5 illustrates the arbitration protocol between multiple requesting processors in the absence of any priority requests. In FIG. 5, during clock cycle 1, processor 0 is the bus master, a signal on bus request line BR0 is asserted and signals on bus request lines BR1, and BR2 are not asserted. Signals on priority request line CPA, DPA and the host bus request line HBR are also not asserted in this scenario, and will remain not asserted during the entire arbitration illustrated in FIG. 5. Assertion of signals on line CPA, DPA, HBR and HBG will be discussed more fully below in connection with FIGS. 6–8.

During clock cycle 2, a signal on line BR1 is asserted, and during clock cycle 3, a signal on line BR2 is asserted. Since assertion of a signal on lines BR1 or BR2 cannot disrupt the current bus master's right to continue as bus master, assertion of signals on lines BR1 and BR2 have no immediate effect on mastership of the bus. Accordingly, processor 0 remains bus master until it completes its transactions and de-asserts the signal on its bus request line BR0 at cycle 5. Cycle 5 is a turn over cycle during which no processor is master of the system bus 14 and no data is transferred over the bus. At cycle 6, processor 1 becomes bus master due to its priority over processor 2. Note that the order in which the processors request the system bus 14 is not determinative of which processor will become the next bus master. Instead, as discussed above, to assure equitable access to the system bus 14 by all processors, a rotating priority scheme is used. Although a rotating priority scheme is used in this embodiment, other priority schemes could be used as well. Thus, processor 1 would become bus master even if the order in which processors 1 and 2 requested the system bus 14 was reversed.

After becoming bus master, processor 1 remains bus master until it has completed its transaction at cycle 10. While processor 1 is bus master, processor 0 asserts a signal on line BR0 at cycle 9. After the turn over cycle (cycle 11), mastership of the system bus 14 transfers to processor 2. Transfer of mastership to processor 2 occurs because processor 2 has priority over processor 0 (processor 0 has the lowest priority due to the fact that it was the last processor to relinquish mastership of the bus 14). Upon completion of its transaction at cycle 16, processor 2 cedes mastership of the system bus 14 to processor 0, which assumes mastership of the system bus 14 during cycle 17.

Mastership of the bus may be interrupted either when the host 10 (having the highest priority in the system) requests the system bus 14 by asserting a signal on the host bus request line HBR or when one of the other processors requests the system bus 14 and asserts a signal on one of the priority request lines CPA or DPA. Arbitration in the presence of a signal on a priority request line will now be discussed with reference to FIGS. 6–8.

Figure 6:
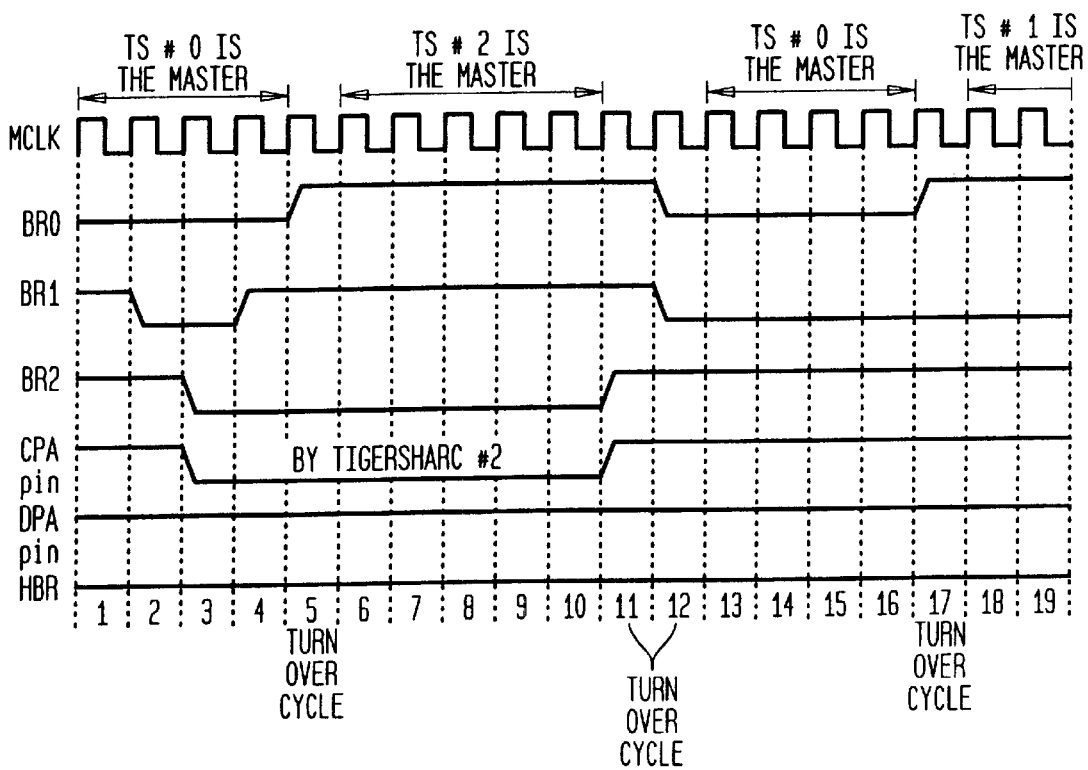

FIG. 6 is a signal diagram illustrating the arbitration protocol when a signal on the CPA priority request line is asserted. As shown in FIG. 6, processor 0 is initially the bus master. During cycle 1, processor 1 asserts a signal on line BR1. As noted above, however, this does not affect bus mastership. Thus, during cycle 2, processor 0 retains bus mastership.

During cycle 3, processor 2 asserts signals on lines BR2 and CPA. Since assertion of a signal on line CPA does affect temporary bus mastership, assertion of signals on lines BR2 and CPA causes processor 1 and processor 0 to take action. Specifically, processor 1, during the next clock cycle (cycle 4) de-asserts the signal on line BR1. Likewise, during cycle 5, processor 0 de-asserts the signal on line BR0 to cede temporary mastership of the system bus 14 to processor 2. After processor 2 has completed its priority transactions at cycle 10, it cedes control of the system bus 14 (cycle 11) by de-asserting the signal on its bust request line and the signal on line CPA. During cycle 12, both processor 1 and processor 0 assert signals on their respective bus request line. However, since processor 0 had mastership of the system bus 14 before the assertion of signals on lines CPA and BR2 by processor 2, processor 0 has priority over processor 1. Accordingly, processor 0 regains mastership of the system bus 14 and is able to complete its transactions. Upon completion of its transactions, processor 0 relinquishes mastership of the system bus 14 at cycle 17 and processor 1 becomes bus master in cycle 18.

Figure 7:
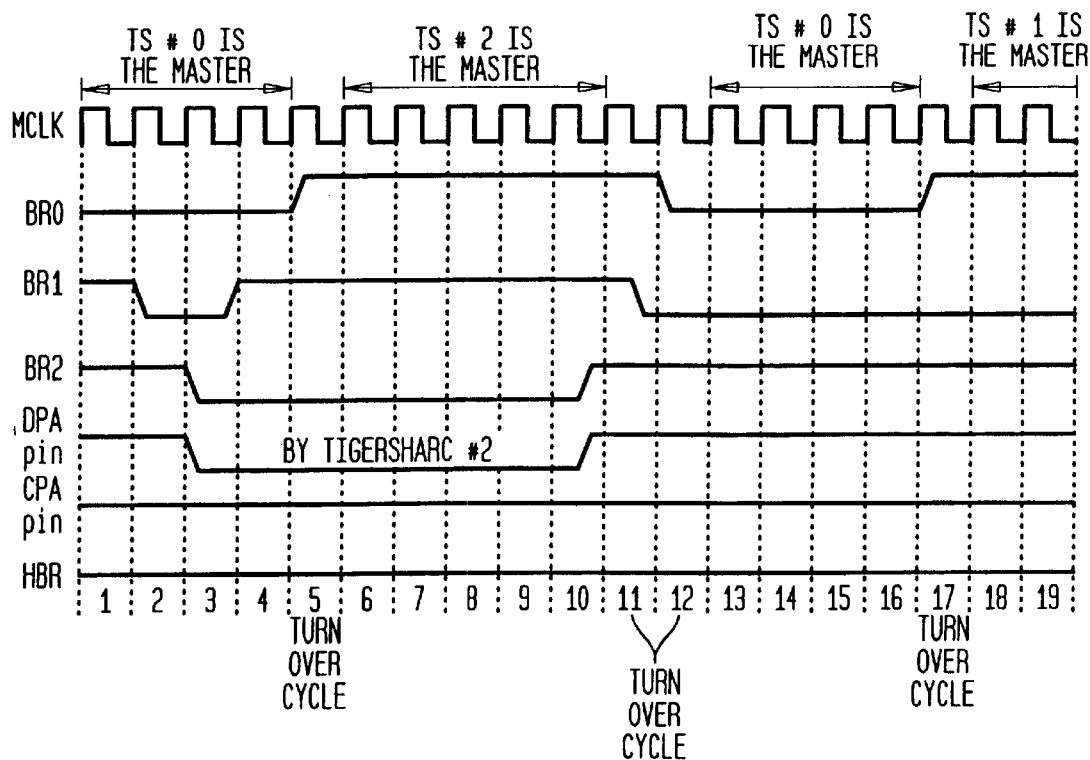

FIG. 7 is a signal diagram of an arbitration involving multiple processors, one of which asserts a signal on the DPA priority request line. As shown in FIG. 6, processor 0 initially has mastership of the bus. During cycle 1, processor 1 asserts a signal on line BR1 without asserting a signal on line CPA or line DPA. As discussed above with respect to FIG. 5, this does not affect mastership of the bus. Accordingly, processor 0 continues to be master of the bus.

During cycle 3, processor 2 asserts signals on both line BR2 and the DPA priority request line. Since this does affect mastership of the bus, during cycle 4, processor 1 de-asserts the signal on line BR1 and processor 0 de-asserts the signal on line BR0. Accordingly, after an idle turn-over cycle (cycle 5), processor 2 becomes bus master.

Upon completion of its transaction, processor 2 de-asserts the signals on lines BR2 and DPA, thus relinquishing mastership of the bus. This causes processor 1 to reassert a signal on line BR1 during cycle 11 and causes processor 0 to reassert a signal on line BR0 during cycle 12. Since processor 0 was the master prior to assertion of the signal on line DPA, processor 0 has priority over processor 1 even though processor 1 reasserted a signal on its bus request line one cycle earlier than processor 0 reasserted a signal on its bus request line. Thus, at cycle 13, processor 0 regains mastership of the bus. Upon completion of its transaction, processor 0 de-asserts the signal on line BR0 at cycle 17, thus relinquishing the system bus 14 to the processor with the then highest priority. As shown in FIG. 6, in this instance, the processor with the next highest priority is processor 1. Processor 1 will retain mastership of the system bus 14 by asserting a signal on line BR1 during its transaction.

In the arbitration process, a processor asserting a signal on the CPA priority request line has a higher priority over a processor asserting a signal on the DPA priority request line. Thus, a processor asserting a signal on line DPA will de-assert the signal on line DPA and its associated bus request line upon sensing that another processor has asserted a signal on line CPA. Since this is straightforward, no further explanation will be provided.

Figure 8:
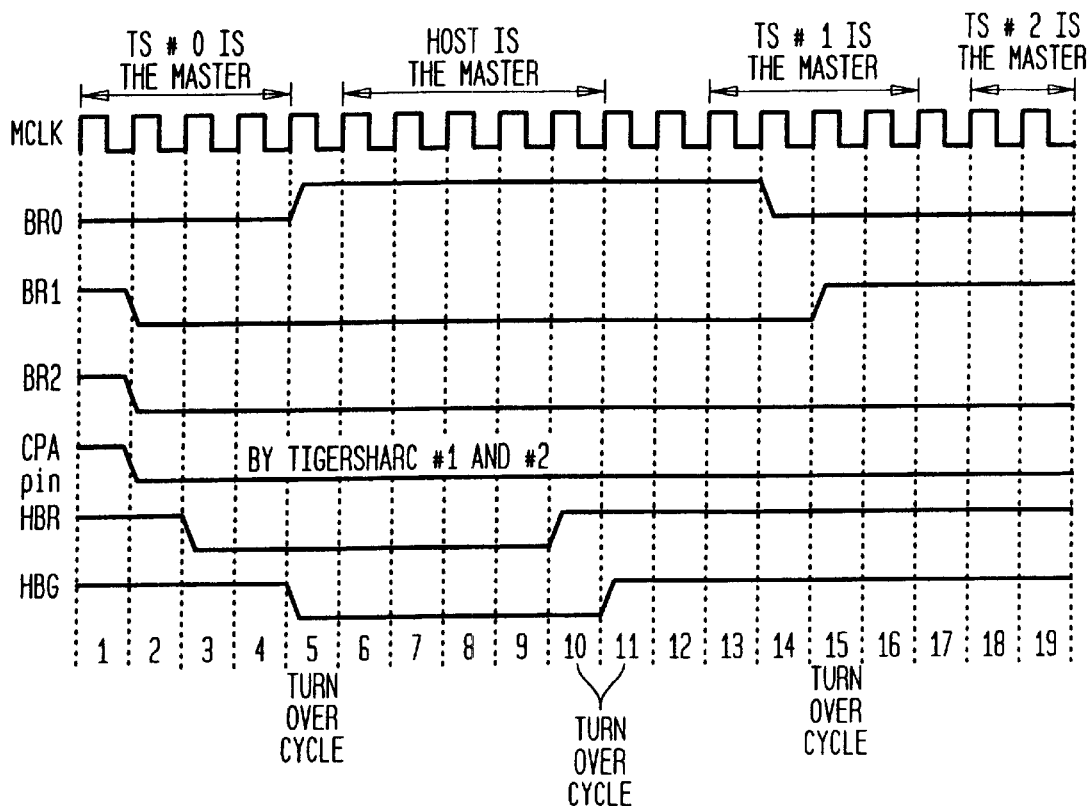

FIG. 8 is a signal diagram of an arbitration involving the simultaneous assertion of two signals on line CPA and assertion by the host 10 of a signal on line HBR. In FIG. 8, during cycle 1, processor 0 is the master and a signal on line BR0 is asserted. During cycle 2, processors 1 and 2 both assert signals on their respective bus request lines, BR1 and BR2, while also simultaneously asserting signals on line CPA. During cycle 3, the host 10 asserts a signal on line HBR.

In response, processor 0 completes its transaction. As shown in this figure, completion of processor 0's transaction may take a cycle or more. Accordingly, in cycle 5, after completion of processor 0's transaction, processor 0 de-asserts the signal on line BR0 and simultaneously asserts a signal on line HBG. Assertion of a signal on line HBG passes mastership of the system bus 14 to the host 10.

The host retains mastership of the system bus 14 for as long as necessary by asserting and maintaining a signal on line HBR. Upon completion of its transaction, the host 10 de-asserts the signal on line HBR at cycle 10 to cede mastership of the bus and to return mastership of the bus to processor 0. However, since processors 1 and 2 have both asserted signals on lines BR1 and BR2 and signals on line CPA, mastership does not return to processor 0 as would otherwise be the case. Instead, since assertion of a signal on line CPA by one or more processors takes priority over a non-priority transaction, mastership passes to one of the processors asserting a signal on line CPA. In this instance, since the signals on line CPA have been asserted by both processor 1 and processor 2, the processor with higher priority is granted mastership of the bus. In the illustrated example, processor 1 is given priority over processor 2 and mastership passes to processor 1 at cycle 12. Upon completion of its transaction, processor 1 relinquishes mastership of the system bus 14 by de-assertion of the signal on its bus request line BR1 and de-assertion of the signal on line CPA (by processor 1) to pass mastership of the system bus 14 to processor 2 at cycle 16.

Note, in this instance, assertion of a signal on line HBR enabled processor 0 to complete its transaction even though a signal on CPA had been asserted by another processor. If this were not the case and processor 0 had not been allowed to complete its transaction prior to relinquishing bus mastership to the host 10, upon completion of the transaction of processor 2, mastership of the system bus 14 would return to processor 0—i.e., processor 0 would have priority over other processors subsequently asserting signals on their respective bus request line without simultaneously asserting a signal on line CPA or DPA.

In addition to a local arbitrator, each processor is also provided with a local DRAM refresh controller 32. As discussed above, DRAM must be refreshed periodically and typically is refreshed by row. As such, a DRAM refresh controller 32 typically has a row counter 34 indicating the row of DRAM last refreshed and a reset for resetting the row counter 34 when the last row of DRAM is refreshed.

Handing off the DRAM refresh between multiple processors 12 is facilitated by providing each processor with an local DRAM refresh controller 32. Additionally, as shown in FIG. 9, the host 10 may be provided with a DRAM refresh controller 32. Providing the host with a DRAM refresh controller 32 is only necessary when the host can itself access the DRAM. Each local DRAM refresh controller 32 is provided with a refresh input pin to receive signals on a refresh line. Signals related to the refresh process are asserted over the line so that all local DRAM refresh controllers 32 have the same input. These signals can be used to increase the DRAM refresh counter 34 or to reset the counter 34. Optionally, the DRAM refresh counter 34 can be configured to automatically revert to the first predefined value upon reaching the second predefined value. Because all local DRAM refresh controllers 32 are of common configuration, are synchronized and are provided with similar inputs, all local DRAM refresh controllers 32 are current as to the state of the DRAM refresh process. Accordingly, when mastership of the system bus 14 is transferred from one processor 12 to another processor 12, the local DRAM refresh controller 32 is able to continue the DRAM refresh process where the prior bus master stopped without excessive duplication.

When mastership of the bus passes to the host 10, the refresh controller makes the DRAM enter a selfish state before tile bus is granted to the host, In this situation, the host does not need to conduct any refresh operation, and indeed is not provided with a DRAM refresh controller (FIG. 3). Optionally, if it was desired to allow the host 10 to access the DRAM directly, the host 10 may be provided with a DRAM refresh controller of common configuration with the other DRAM refresh controllers contained in the processors 12a–12n as shown in FIG. 9.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. An apparatus, comprising:

a bus;

a first processor connected to the bus;

a second processor connected to the bus;

a memory, a first local memory refresh controller associated with the first processor and configured to control refresh operations of the memory;

a second local memory refresh controller associated with the second processor and configured to control refresh operations of the memory; and a refresh line connected to the first local memory refresh controller and the second local memory refresh controller over which refresh signals can be received by both the first local memory refresh controller and the second local memory refresh controller.

2. The apparatus of claim 1, wherein the first and second local memory refresh controllers are of common configuration.

3. The apparatus of claim 2, wherein the first and second local memory refresh controllers operate synchronously.

4. The apparatus of claim 1, wherein each of the first and second local memory refresh controllas comprises a dedicated input pin, a refresh counter and a reset.

5. The apparatus of claim 1, wherein the memory is a DRAM, and wherein the first and second local memory refresh controllers are local DRAM refresh controller.

* * * * *